(12) United States Patent
Ryu et al.

(10) Patent No.: US 11,731,395 B2
(45) Date of Patent: Aug. 22, 2023

(54) DISPLAY MODULE

(71) Applicant: Samsung Display Co., LTD., Yongin-si (KR)

(72) Inventors: Dohyung Ryu, Yongin-si (KR); Wu Hyeon Jung, Seoul (KR); Daehyun Hwang, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 274 days.

(21) Appl. No.: 17/242,745

(22) Filed: Apr. 28, 2021

(65) Prior Publication Data

US 2022/0063243 A1 Mar. 3, 2022

(30) Foreign Application Priority Data

Aug. 27, 2020 (KR) .......................... 10-2020-0108842

(51) Int. Cl.
*B32B 7/06* (2019.01)
*B32B 7/12* (2006.01)
*H10K 50/84* (2023.01)

(52) U.S. Cl.
CPC .................. *B32B 7/06* (2013.01); *B32B 7/12* (2013.01); *H10K 50/84* (2023.02); *B32B 2307/558* (2013.01); *B32B 2457/20* (2013.01)

(58) Field of Classification Search
CPC ....... B32B 7/06; B32B 7/12; B32B 2307/558; B32B 2457/20; B32B 3/266; B32B 3/30;
(Continued)

(56) References Cited

U.S. PATENT DOCUMENTS 8,236,400 B2* 8/2012 Trigg ...................... B44C 1/105
428/40.1
8,333,408 B2* 12/2012 Flynn .................... G06F 1/1656
283/105
(Continued)

FOREIGN PATENT DOCUMENTS

KR 1020170104679 A 9/2017
KR 1020180138249 A 12/2018
(Continued)

OTHER PUBLICATIONS

Machine translation of KR 200491778 Y!. (Year: 2020).*
Machine translation of TW M504700U. (Year: 2015).*

*Primary Examiner* — Patricia L. Nordmeyer
(74) *Attorney, Agent, or Firm* — Cantor Colburn LLP

(57) ABSTRACT

A display module includes a display panel which is bent at opposing ends thereof and includes a flat area and a bent area which extends bent from the flat area, a panel protective film facing both the flat area and the bent area of the display panel, and a release film removably attached to the panel protective film. The release film includes a first release film facing both the flat area and the bent area of the display panel with the panel protective film therebetween, a second release film facing the display panel with the first release film therebetween, a third release film between the first release film and the second release film and corresponding to the bent area, and a first adhesive layer between the third release film and the second release film and attaches the third release film to the second release film.

20 Claims, 15 Drawing Sheets

(58) Field of Classification Search
CPC ..... B32B 7/022; B32B 27/08; B32B 2255/26; B32B 27/281; B32B 27/32; B32B 27/38; B32B 2307/748; B32B 1/00; B32B 27/36; B32B 27/40; B32B 29/00; B32B 2250/44; B32B 2307/4026; B32B 2307/41; B32B 2307/51; B32B 2307/56; B32B 2307/732; B32B 2457/208; B32B 7/14; B32B 27/308; H10K 50/84; H10K 59/87; H10K 59/00; H10K 2102/311; G06F 1/1637; G09F 9/00; G09F 9/301; C09J 7/10; C09J 7/40; C09J 2203/318
See application file for complete search history.

(56) References Cited

U.S. PATENT DOCUMENTS

| | | | | |
|---|---|---|---|---|
| 9,079,383 | B2* | 7/2015 | Tapio | B32B 38/10 |
| 2006/0062953 | A1* | 3/2006 | Trigg | B44C 1/105 |
| | | | | 428/40.1 |
| 2009/0186181 | A1* | 7/2009 | Mase | B29C 63/02 |
| | | | | 156/60 |
| 2011/0309608 | A1* | 12/2011 | Flynn | G09F 3/10 |
| | | | | 283/81 |
| 2012/0057287 | A1* | 3/2012 | Chaves | C09J 7/22 |
| | | | | 361/679.3 |
| 2012/0076967 | A1* | 3/2012 | Muramatsu | B29C 63/0004 |
| | | | | 428/41.8 |
| 2013/0048203 | A1* | 2/2013 | Yau | B44C 1/17 |
| | | | | 428/41.5 |
| 2013/0171400 | A1* | 7/2013 | Lin | B29C 63/0095 |
| | | | | 156/247 |
| 2016/0043765 | A1* | 2/2016 | Ozeki | B32B 27/32 |
| | | | | 428/41.8 |
| 2016/0107421 | A1* | 4/2016 | Chung | B32B 17/00 |
| | | | | 428/41.8 |

FOREIGN PATENT DOCUMENTS

| | | |
|---|---|---|
| KR | 1020190073011 A | 6/2019 |
| KR | 10-2043333 B1 | 11/2019 |
| KR | 200491778 Y1 * | 6/2020 |
| TW | M504700 U * | 7/2015 |

* cited by examiner

DISPLAY MODULE

This application claims priority to Korean Patent Application No. 10-2020-0108842, filed on Aug. 27, 2020, and all the benefits accruing therefrom under 35 U.S.C. § 119, which is hereby incorporated by reference for all purposes as if fully set forth herein.

BACKGROUND

(1) Field

Embodiments relate to a display module. More particularly, embodiments relate to a display module including a display panel and a protective film.

(2) Description of the Related Art

A display module may include a display panel and a protective film which is under the display panel. The protective film may include a panel protective film and a release film which is under the panel protective film. After removing the release film from the display module, a display device may be manufactured by assembling various sets. The release film may protect the display panel and the panel protective film until the display panel and the panel protective film are assembled to a set.

SUMMARY

Embodiments provide a display module with improved reliability.

Additional features will be set forth in the description which follows, and in part will be apparent from the description, or may be learned by practice of the embodiments.

A display module includes a display panel which is bent at opposing ends thereof, the display panel including a flat area and a bent area which extends bent from the flat area, a panel protective film which faces both the flat area and the bent area of the display panel, and a release film which is removably attached to the panel protective film. The release film includes a first release film which faces both the flat area and the bent area of the display panel with the panel protective film therebetween, a second release film which faces the display panel with the first release film therebetween, a third release film which is between the first release film and the second release film and corresponds to the bent area, and a first adhesive layer which is between the third release film and the second release film and attaches the third release film to the second release film.

According to an embodiment, the third release film may directly contact the first release film.

According to an embodiment, the third release film may be unattached to the first release film.

According to an embodiment, the third release film may be spaced apart from the first release film.

According to an embodiment, the first adhesive layer may include a first portion directly contacting the first release film and a second portion directly contacting the third release film.

According to an embodiment, the first portion of the first adhesive layer may attach the first release film to the second release film. The second portion of the first adhesive layer may attach the third release film to the second release film.

According to an embodiment, the first portion of the first adhesive layer may overlap the flat area. The second portion of the first adhesive layer may overlap the bent area.

According to an embodiment, a thickness of the third release film may be less than a thickness of the first release film.

According to an embodiment, the display module may further include a second adhesive layer between the panel protective film and the first release film. The second adhesive layer may have an adhesive force with the panel protective film and an adhesive force with the first release film, and the adhesive force of the second adhesive layer with the panel protective film may be less than the adhesive force of the second adhesive layer with the first release film.

According to an embodiment, the display panel may include a sensing area in the flat area. The panel protective film may define an opening exposing the sensing area of the display panel. The display module may further include a first buffer member (e.g., impact-absorbing pattern) between the panel protective film and the second release film and extending along the opening.

According to an embodiment, the first release film may define an opening which corresponds to the opening of the panel protective film, and the impact-absorbing pattern may be in the opening of the first release film.

According to an embodiment, the second release film may extend across the opening of the panel protective film and dispose both the impact-absorbing pattern and the first release film between the display panel and the second release film.

According to an embodiment, the third release film may be spaced apart from the first buffer member.

According to an embodiment, the first buffer member may extend from the opening of the first release film and further than the first release film in a direction away from the display panel.

According to an embodiment, the display module may further include a step-difference compensation film which is between the first adhesive layer and the second release film and defines an opening which corresponds to the opening of the panel protective film, and the first buffer member may be in the opening of the step-difference compensation film.

According to an embodiment, the release film may further include a fourth release film which faces the first buffer member with the second release film therebetween and corresponds to the opening of the panel protective film.

According to an embodiment, the fourth release film may include a light blocking material.

According to an embodiment, the second and third release films may together define a plurality of grooves passing through the second and third release films and spaced apart from each other along a boundary between the flat area and the bent area.

According to an embodiment, at the flat area of the display panel, each of the plurality of grooves may correspond to the panel protective film.

According to an embodiment, each of the plurality of grooves may expose the first release film to outside the release film.

The display module according to one or more embodiments may include the flat area and the bending area (e.g., bent area). The display module may include the first and second release films removably attached to the bottom of the panel protective film, and the third release film in the bending area between the first and second release films. Adhesive may not be between the first release film and the third release film. Accordingly, an adhesion failure between the bending area of the panel protective film and the bending area of the release film may be improved. Accordingly, reliabilities of the display panel and the display module which includes the display panel may be improved.

It is to be understood that both the foregoing general description and the following detailed description are explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the invention.

DETAILED DESCRIPTION

Figure 1:
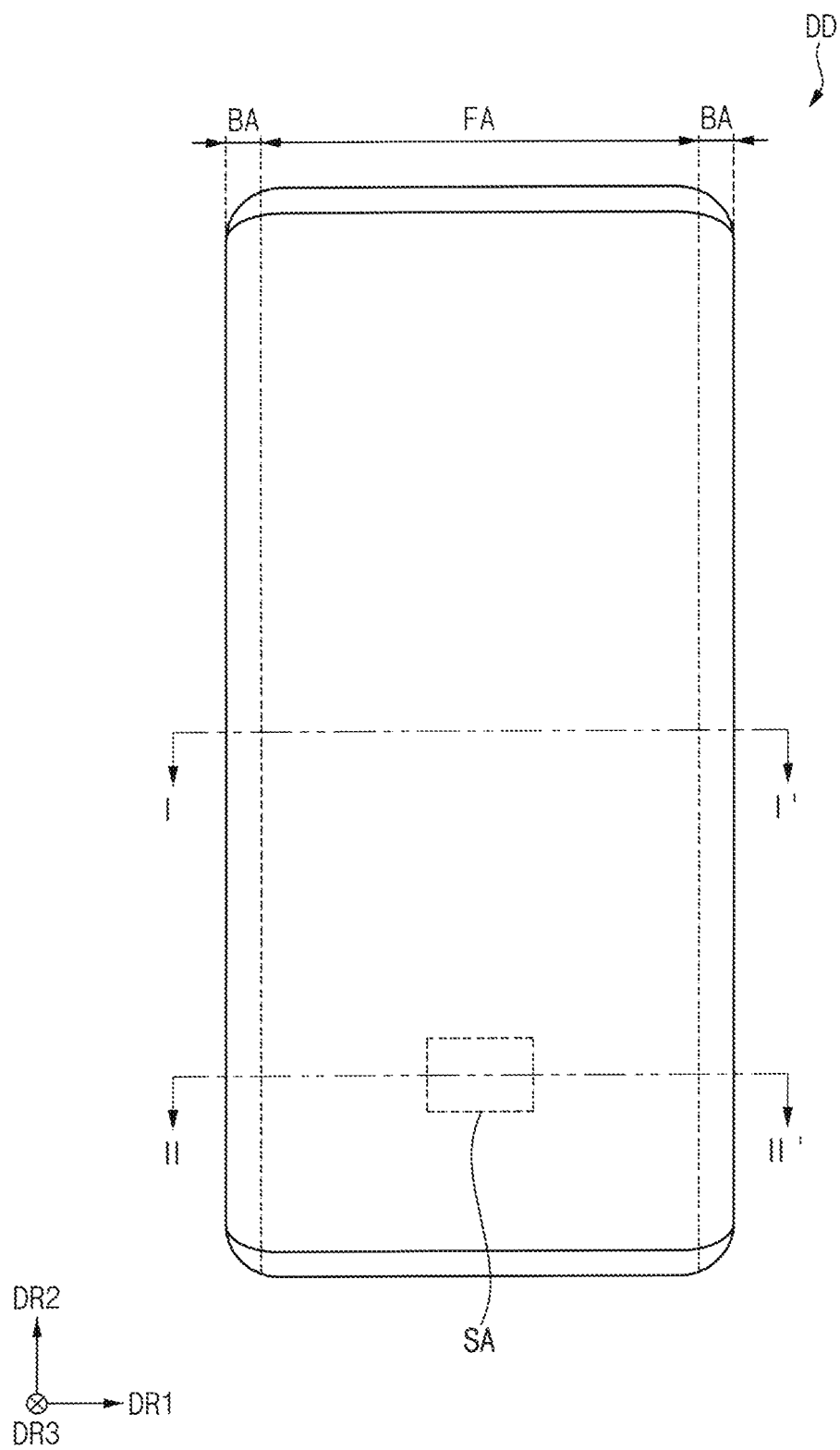
FIG. 1 is a plan view illustrating an embodiment of a display device.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

A display panel 300 and a panel protective film 400 of a display module DM may include a flat area FA and a bending area BA which is extended from the flat area FA. As the thickness of a release layer which is removably attached to the panel protective film 400 increases, an adhesion failure may occur between the bending area BA of the panel protective film 400 and the bending area BA of the release layer.

Illustrative, non-limiting embodiments will be more clearly understood from the following detailed description in conjunction with the accompanying drawings.

Figure 2A:
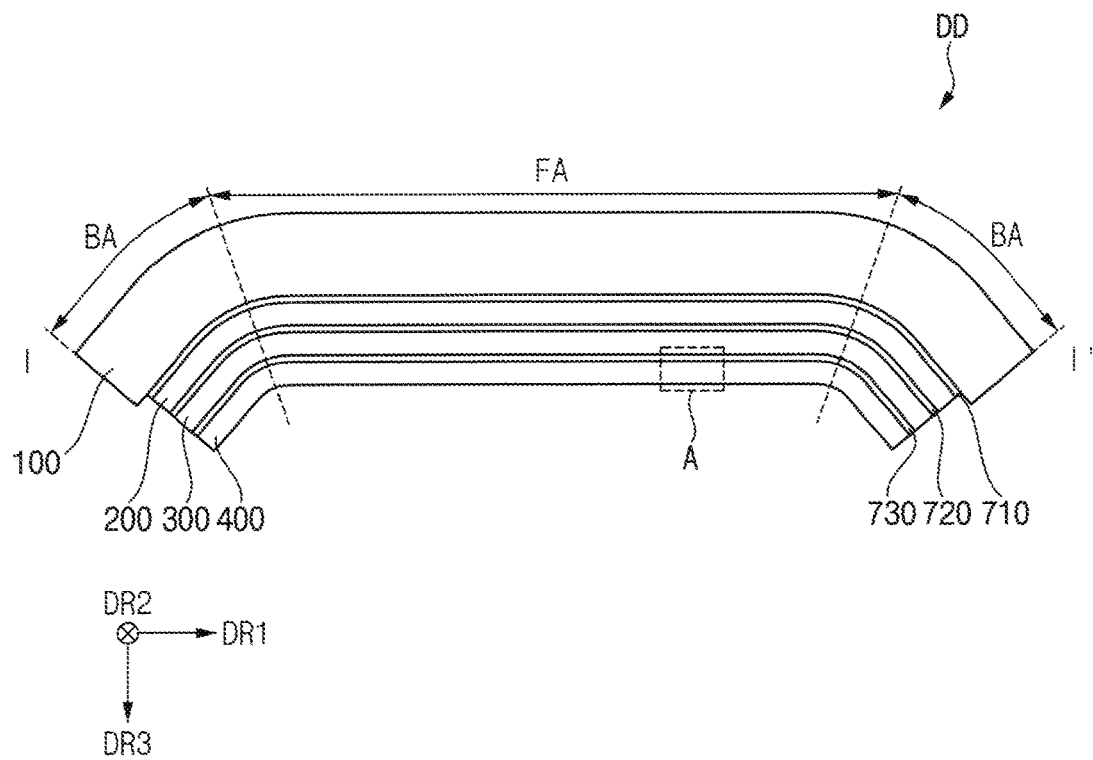
FIG. 2A is a cross-sectional view taken along line I-I' of FIG. 1.
Figure 2B:
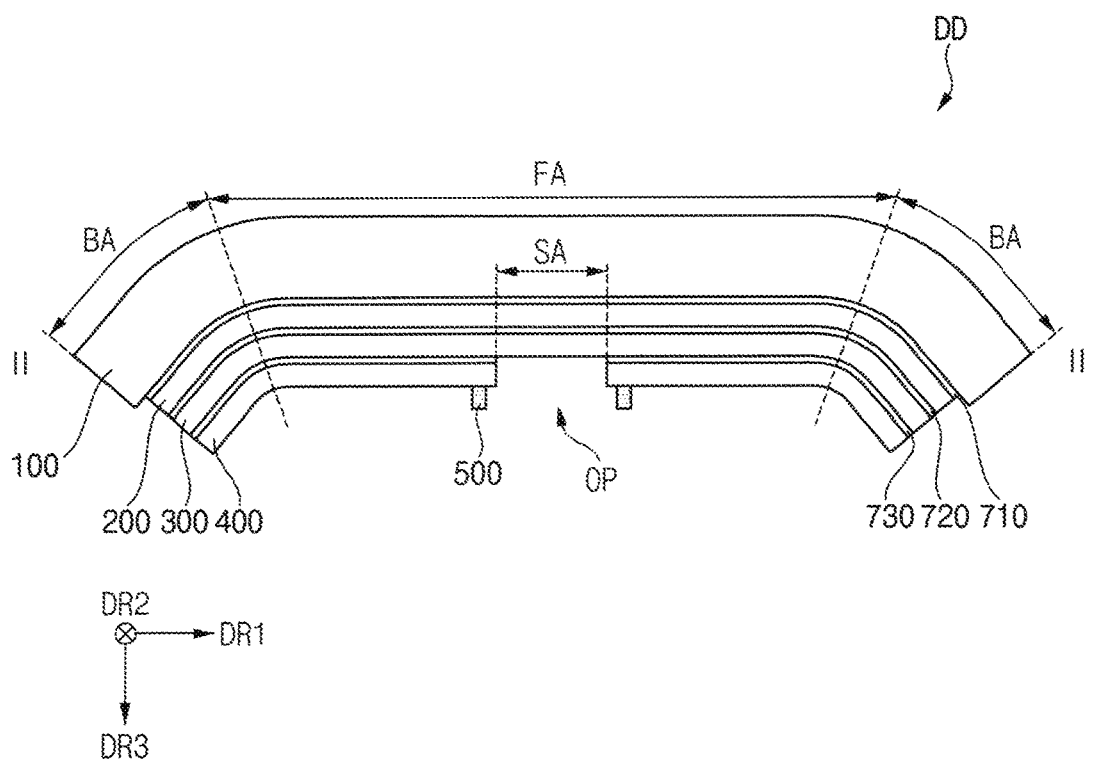
FIG. 2B is a cross-sectional view taken along line II-II' of FIG. 1.

FIG. 1 is a plan view illustrating an embodiment of a display device DD. FIG. 2A is a cross-sectional view taken along line I-I' of FIG. 1. FIG. 2B is a cross-sectional view taken along line II-II' of FIG. 1.

Referring to FIGS. 1 to 2B, a display device DD may include a flat area FA (e.g., flat portion) and a bending area BA (e.g., bent area or bent portion) which is connected to the flat area FA to be extended bent therefrom. In a plan view, the bending area BA may be extended around the flat area FA. A sensing area SA may be positioned inside the flat area FA.

The flat area FA may have a substantially flat upper surface. The bending area BA may be positioned outside the flat upper surface. The bending area BA may extend bent from the flat area FA. Referring to FIG. 1, for example, the bending area BA may be adjacent to both long sides of the flat area FA. The flat area FA may be in a plane (e.g., a first plane) which is defined by a first direction DR1 and a second direction DR2 crossing each other. That is, the bending area BA may be provided or formed extended in a first direction DR1 and along a direction opposite to the first direction DR1 (e.g., left and right) from the flat area FA. In an embodiment, for example, the bending area BA may be adjacent to both short sides of the flat area FA. That is, the bending area BA may be provided or formed extended in a second direction DR2 and a direction opposite to the second direction DR2 from the flat area FA. The bending area BA may include or define a first end portion of the display device DD and a second end portion of the display device DD at opposing sides of the flat area FA. That is, the display module DM may include the display panel DP which is bent at opposing ends thereof to define the bending area BA.

As shown in FIGS. 1, 2A and 2B, the display device DD which is flat disposes the first end portion and the second end portion (e.g., the bending area BA) coplanar with each other and in a plane (e.g., second plane) which is defined by the first direction DR1 and the second direction DR2 crossing each other and different from the first plane. The second plane may be parallel to the first plane in which the flat area FA is disposed and spaced apart from each other along the third direction DR3. The bending area BA may be bent downward (e.g., in a third direction DR3) from the flat area FA. In an embodiment, the bending area BA may have an upper surface convexly curved in an outward direction relative to the flat area FA.

The display device DD may display an image through a display surface (e.g., an upper surface of the display device DD). The display surface may be positioned over an entirety of the flat area FA and an entirety of the bending area BA. In an embodiment, for example, the display device DD may display the image through both the flat upper surface of the flat area FA and the curved upper surface of the bending area BA.

In an embodiment, the display device DD may include a window 100, a touch member 200, a display panel 300 and a panel protective film 400 in order. In an embodiment, for example, each of the window 100, the touch member 200, the display panel 300 and the panel protective film 400 may include a flat area FA and a bending area BA corresponding to those described above for the display device DD. The display device DD may include the panel protective film 400 which faces both the flat area FA and the bent area (e.g., bending area BA) of the display panel 300.

The display panel 300 may generate and display the image. In an embodiment, for example, the display panel 300 may be an organic light emitting display panel, a liquid crystal display panel, a plasma display panel or an electrophoretic display panel, but is not limited thereto and may include other display panels displaying the image.

The display panel 300 may include a plurality of light emitting devices disposed on a substrate. In an embodiment, for example, the substrate may be a rigid substrate including or made of glass or the like, or a flexible substrate including or made of plastic or the like. Accordingly, the display panel 300 may be rigid or flexible. The display panel 300 may further include a sensing area SA in the flat area FA at which an external input to the display module DM is sensible.

The window 100 may be disposed on the display panel 300. The window 100 may be optically transparent. The window 100 may protect the display panel 300 and transmit light emitted from the display panel 300. The window 100 may provide the upper surface of the display device DD.

The touch member 200 may be disposed between the window 100 and the display panel 300. In an embodiment, for example, the touch member 200 may sense an external input such as light, pressure or contact from an input tool such as a portion of a body (e.g., hand), a stylus pen and so forth. Optionally, the touch member 200 may be omitted.

The panel protective film 400 may be disposed under the display panel 300. The panel protective film 400 may face the window 100 with the touch member 200 and display panel 300 therebetween. In an embodiment, for example, the panel protective film 400 may be attached to a lower surface of the display panel 300 which is furthest from the window 100 and may protect the display panel 300.

In an embodiment, as shown in FIG. 2B, the panel protective film 400 may include an opening OP (e.g., first opening) at the sensing area SA of the display panel 300. The opening OP may expose the lower surface of the display panel 300 at the sensing area SA to outside the display device DD. That is, the panel protective film 400 defines an opening OP which corresponds to the sensing area SA and exposes the display panel DP to outside the panel protective film 400.

Although not shown in the drawing, an optical sensor may be disposed under the panel protective film 400. The optical sensor may overlap or correspond to the opening OP. That is, the optical sensor may face a portion of the display panel 300 which is exposed at the sensing area SA through the opening OP. In an embodiment, for example, the optical sensor may be a fingerprint recognition sensor using infrared light. However, this is exemplary, and the optical sensor is not limited thereto.

In an embodiment, the display device DD may further include a first buffer member 500 disposed under the panel protective film 400. The first buffer member 500 may be protruded from the panel protective film 400 at the opening OP and forms a step with the panel protective film 400. In a plan view, the first buffer member 500 may surround the opening OP. The first buffer member 500 may extend along a periphery of the opening OP. The first buffer member 500 may absorb an external shock (e.g., impact-absorbing member or impact-absorbing pattern). That is, the display module DM may include an impact-absorbing pattern (e.g., first buffer member 500) which protrudes from the panel protective film 400 in a direction away from the display panel 300 and extends along the opening OP of the panel protective film 400.

In an embodiment, for example, the first buffer member 500 may include or be formed of a single layer or a plurality of laminated layers. In an embodiment, for example, the first buffer member 500 may include a material having elasticity such as polyurethane or polyethylene resin. In an embodiment, for example, the first buffer member 500 may further include a light blocking material such as a light blocking pigment, a light blocking dye or carbon black.

In an embodiment, as shown in FIGS. 2A and 2B, adhesive layers 710, 720 and 730 (e.g., first adhesive layer, second adhesive layer and third adhesive layer) may be disposed between the window 100 and the touch member 200, between the touch member 200 and the display panel 300, and between the display panel 300 and the panel protective film 400, respectively. In an embodiment, for example, each of the adhesive layers 710, 720 and 730 may be an organic adhesive such as an optically clear adhesive ("OCA"), an optically clear resin ("OCR") or a pressure sensitive adhesive ("PSA"). The organic adhesive may include an adhesive material such as polyurethane-based material (e.g., including polyurethane), polyacrylic-based material (e.g., including polyacrylic), polyester-based material (e.g., including polyester) or polyepoxy-based material (e.g., including polyepoxy).

Although not shown in the drawings, in an embodiment, the display device DD may further include a bracket, a housing and/or an electronic component. In an embodiment, for example, the bracket may be disposed under the display panel 300 and may support the display panel 300. The housing may be coupled to the window 100 to accommodate the display panel 300 between the housing and the window 100. A space may be defined between the bracket and the housing, and the electronic component may be disposed in the space. In an embodiment, for example, the electronic component may include a battery, a camera module or the like.

Figure 3:
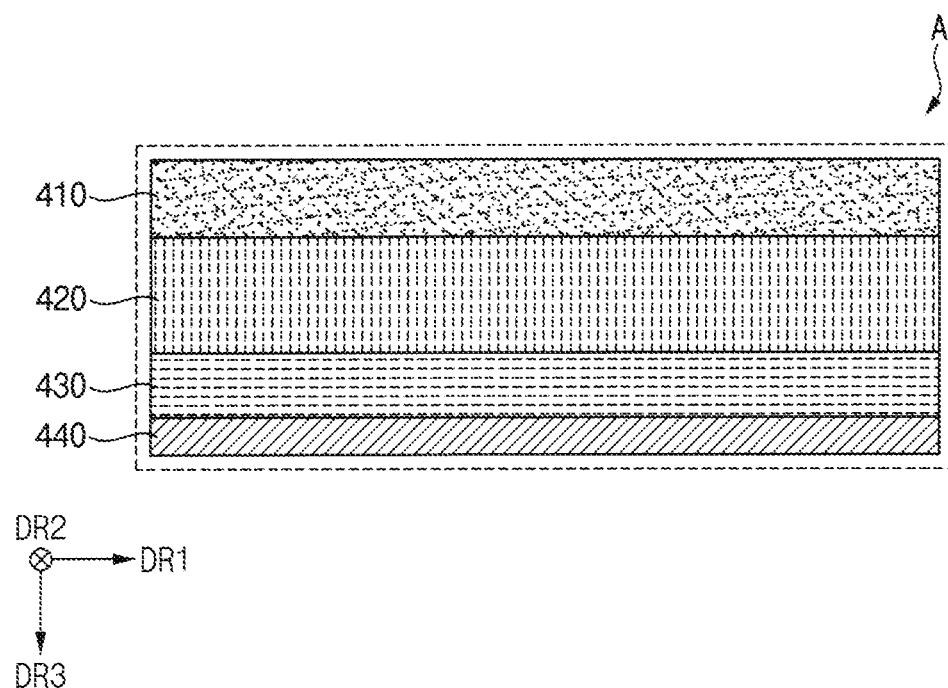
FIG. 3 is an enlarged cross-sectional view illustrating an area "A" of FIG. 2A.

FIG. 3 is an enlarged cross-sectional view illustrating an embodiment of an area "A" of FIG. 2A.

Referring to FIGS. 2A and 3, the panel protective film 400 may include a light blocking member 410 (e.g., light blocking layer), a second buffer member 420, a support member 430 (e.g., support layer), and a heat dissipating member 440 (e.g., heat dissipating layer).

The light blocking member 410 may be attached to the lower surface of the display panel 300. The light blocking member 410 may include an organic material and a light blocking material. In an embodiment, for example, the light blocking member 410 may have a dark color (e.g., black). In an embodiment, an embossed shape may be provided or formed at an upper surface of the light blocking member 410. The embossed shape may serve as an air passage during the attachment of the panel protective film 400 to the lower surface of the display panel 300. Accordingly, air bubbles between the display panel 300 and the panel protective film 400 may be reduced. In an embodiment, for example, when the panel protective film 400 is completely attached to the lower surface of the display panel 300, the embossed shape of the light blocking member 410 may be collapsed and provide a planarized upper surface of the light blocking member 410.

The second buffer member 420 may be disposed under the light blocking member 410. The second buffer member 420 may absorb an external shock and may reduce or effectively prevent damage to the display panel 300 (e.g., impact-absorbing layer). In an embodiment, for example, the second buffer member 420 may include or be formed of a single layer or a plurality of laminated layers. In an embodiment, for example, the second buffer member 420 may include a material having elasticity such as polyurethane or polyethylene resin.

The support member 430 may be disposed under the second buffer member 420. The support member 430 may face the light blocking member 410 with the second buffer member 420 therebetween. In an embodiment, for example, the support member 430 may include an organic material such as polyethylene terephthalate ("PET") or polyimide ("PI").

The heat dissipating member 440 may be disposed under the support member 430. The heat dissipating member 440 may shield noise and may dissipate heat emitted from the electronic component of the display device DD. The heat dissipating member 440 may include conductive material such as a metal. In an embodiment, for example, the heat dissipating member 440 may include copper (Cu).

Although not shown in the drawings, adhesives may be disposed respectively between the light blocking member 410, the second buffer member 420, the support member 430 and the heat dissipating member 440.

Figure 4A:
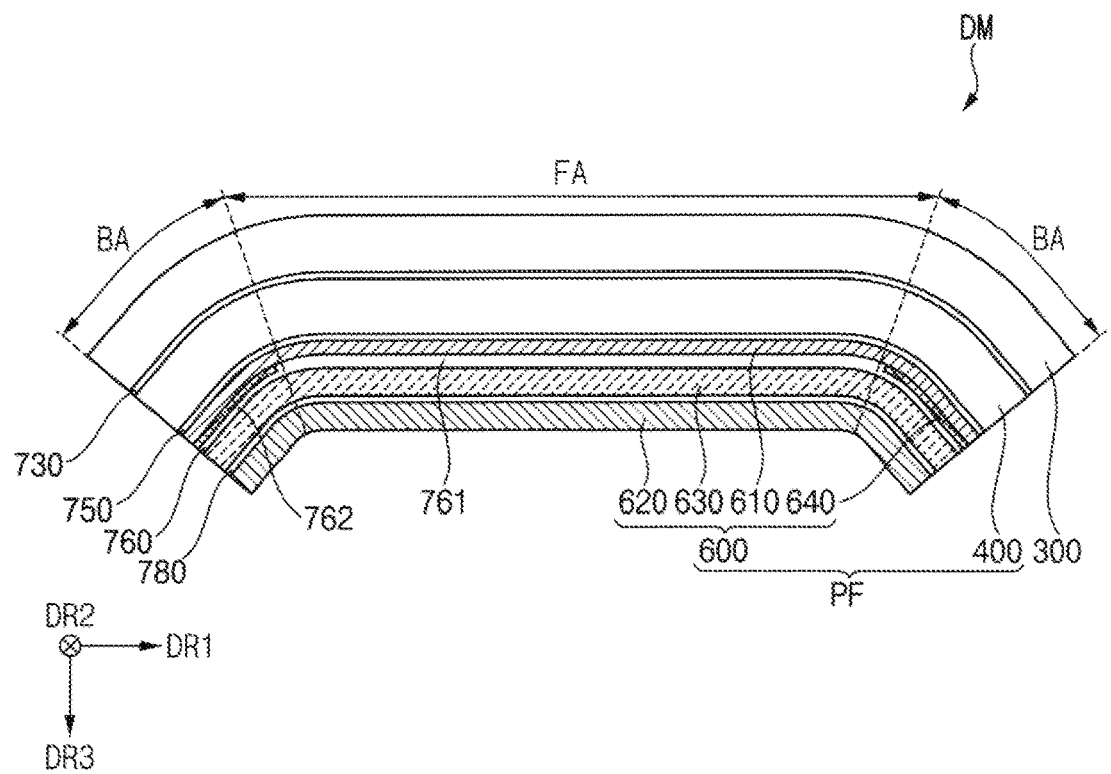
FIGS. 4A and 4B are cross-sectional views of an embodiment of a display module.
Figure 4B:
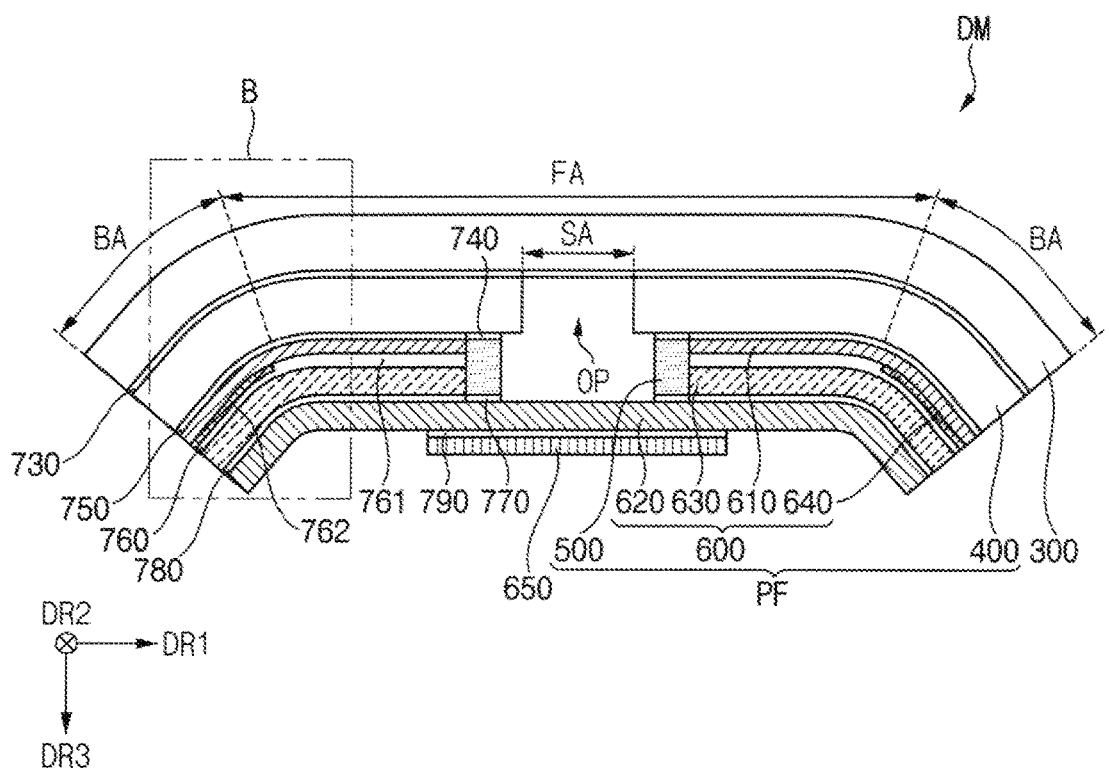
Figure 5:
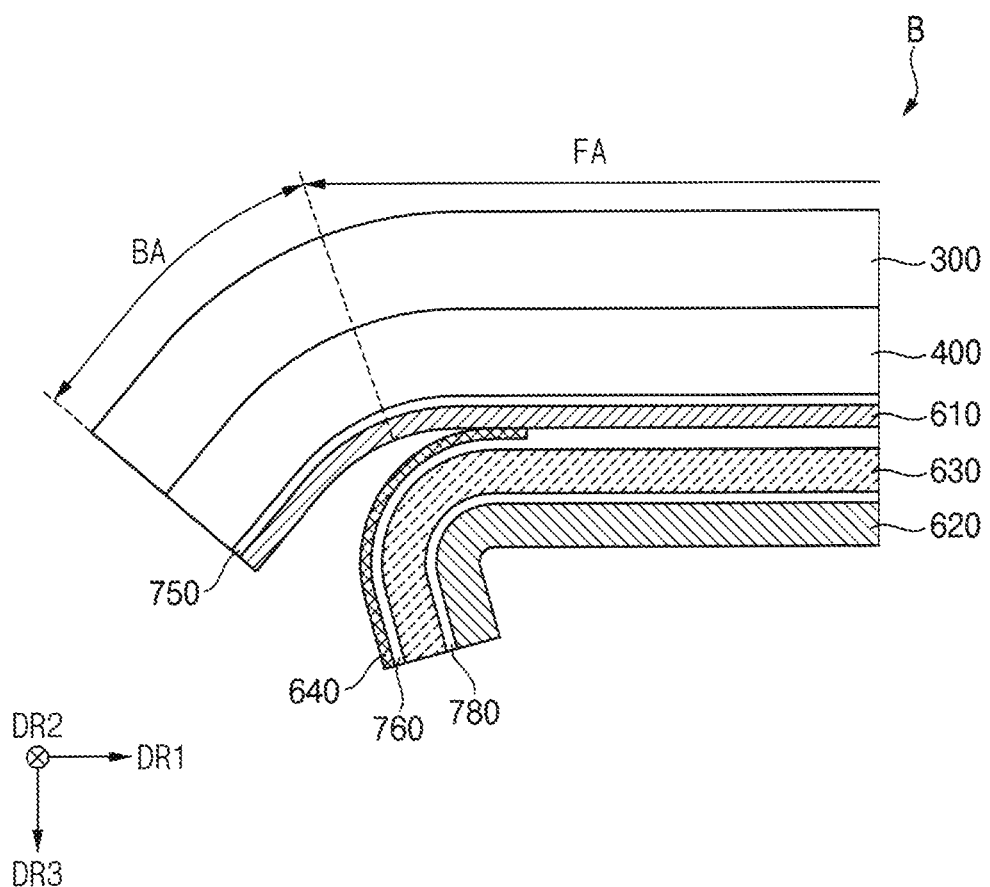
FIG. 5 is an enlarged cross-sectional view illustrating an area "B" of FIG. 4B.

FIGS. 4A and 4B are cross-sectional views of an embodiment of a display module DM. FIG. 5 is an enlarged cross-sectional view illustrating an embodiment of an area "B" of FIG. 4B. FIGS. 6A to 6G are plan views of embodiments of a display module DM.

FIG. 4A may correspond to line I-I' of FIG. 1, and FIG. 4B may correspond to line II-IP of FIG. 1. FIGS. 6A to 6G may be plan views illustrating embodiments of a lower surface of a display module DM.

Referring to FIGS. 4A to 6G, a display module DM may include the display panel 300 and a protective film PF. The protective film PF may include the panel protective film 400, a first buffer member 500 and a release film 600. In an embodiment, for example, the display panel 300 and the protective film PF which is attached to the display panel 300 may define the display module DM. In an embodiment, for example, the protective film PF may further include adhesive layers 730, 740, 750, 760, 770 and 780 (e.g., third adhesive layer, fourth adhesive layer, fifth adhesive layer, sixth adhesive layer, seventh adhesive layer and eighth adhesive layer, or third through eighth adhesive patterns, respectively).

The display panel 300 to which the panel protective film 400 and the first buffer member 500 are attached may be assembled with various sets of the display device DD (e.g., the brackets, the electronic components, etc.) and may be variously provided. As the display device DD becomes thinner, the panel protective film 400 having a relatively thin thickness may be attached to the lower surface of the display panel 300. Accordingly, a defect may occur in the display panel 300 before assembly with the set.

Accordingly, one or more embodiment of the protective film PF may additionally include the release film 600 for protecting the display panel 300 during a process in providing or manufacturing the display device DD. The release film 600 may remain attached to the bottom of the panel protective film 400 and the first buffer member 500 until the display panel 300 having the panel protective film 400 and the first buffer member 500 attached thereto are attached to a set. Accordingly, the release film 600 may protect the display panel 300 having the panel protective film 400 attached thereto before assembly with the set. In assembly of the set with the display panel 300, the release film 600 may be peeled off from the display panel 300, the panel protective film 400 and the first buffer member 500. That is, the release film 600 is removably attachable to the display panel 300, the panel protective film 400 and the first buffer member 500. In an embodiment, in removal of the release film 600 from the display panel 300, the panel protective film 400 and the first buffer member 500, the first release film 610, the second release film 620, the step-difference compensation film 630, the third release film 640 and the various adhesive layers and patterns of the release film 600 are removable together with each other.

As described above, the panel protective film 400 may include the opening OP exposing the display panel 300 at the sensing area SA. The first buffer member 500 may be disposed under the panel protective film 400 to surround the opening OP. FIG. 6B illustrates that the first buffer member 500 is spaced apart from a sidewall of the panel protective film 400 which defines the opening OP by a distance, but the first buffer member 500 may not be spaced apart from the opening OP. In an embodiment, the first buffer member 500 may be aligned with the sidewall of the panel protective film which defines the opening OP.

In an embodiment, a first adhesive pattern 740 may be disposed between the panel protective film 400 and the first buffer member 500. The first buffer member 500 may be adhered to the panel protective film 400 by the first adhesive pattern 740. An upper surface of the first adhesive pattern 740 may contact a lower surface of the panel protective film 400 (e.g., a lower surface of the heat dissipating member 440). A lower surface of the first adhesive pattern 740 may contact an upper surface of the first buffer member 500. In an embodiment, for example, the first adhesive pattern 740 may have substantially the same shape as the first buffer member 500 in a plan view. As used herein, elements which contact each other may form an interface therebetween.

The release film 600 may include a first release film 610, a second release film 620, a step-difference compensation film 630 and a third release film 640. The release film 600 may be removably attached to the panel protective film 400.

The first release film 610 may be disposed under the panel protective film 400, and may overlap the flat area FA and the bending area BA. The first release film 610 may be closest to the panel protective film 400 among the first release film 610, the second release film 620, the step-difference compensation film 630 and the third release film 640. The first release film 610 may be removably attached to the lower surface of the panel protective film 400 until being peeled off from the panel protective film 400, and may protect the panel protective film 400. In an embodiment, for example, the first release film 610 may include PET, PI or paper.

Figure 6A:
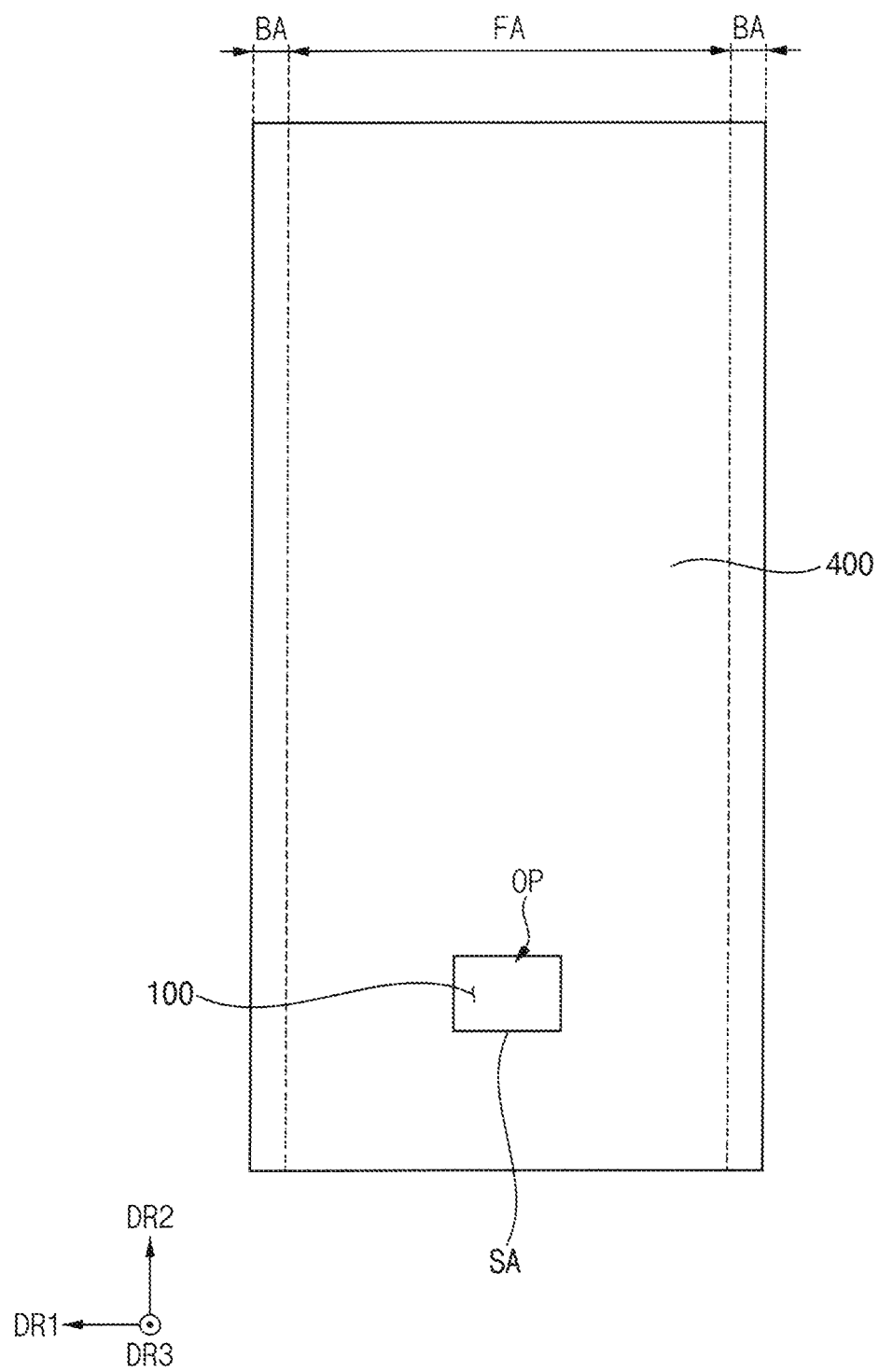
FIGS. 6A to 6G are plan views of embodiments of a display module.
Figure 6B:
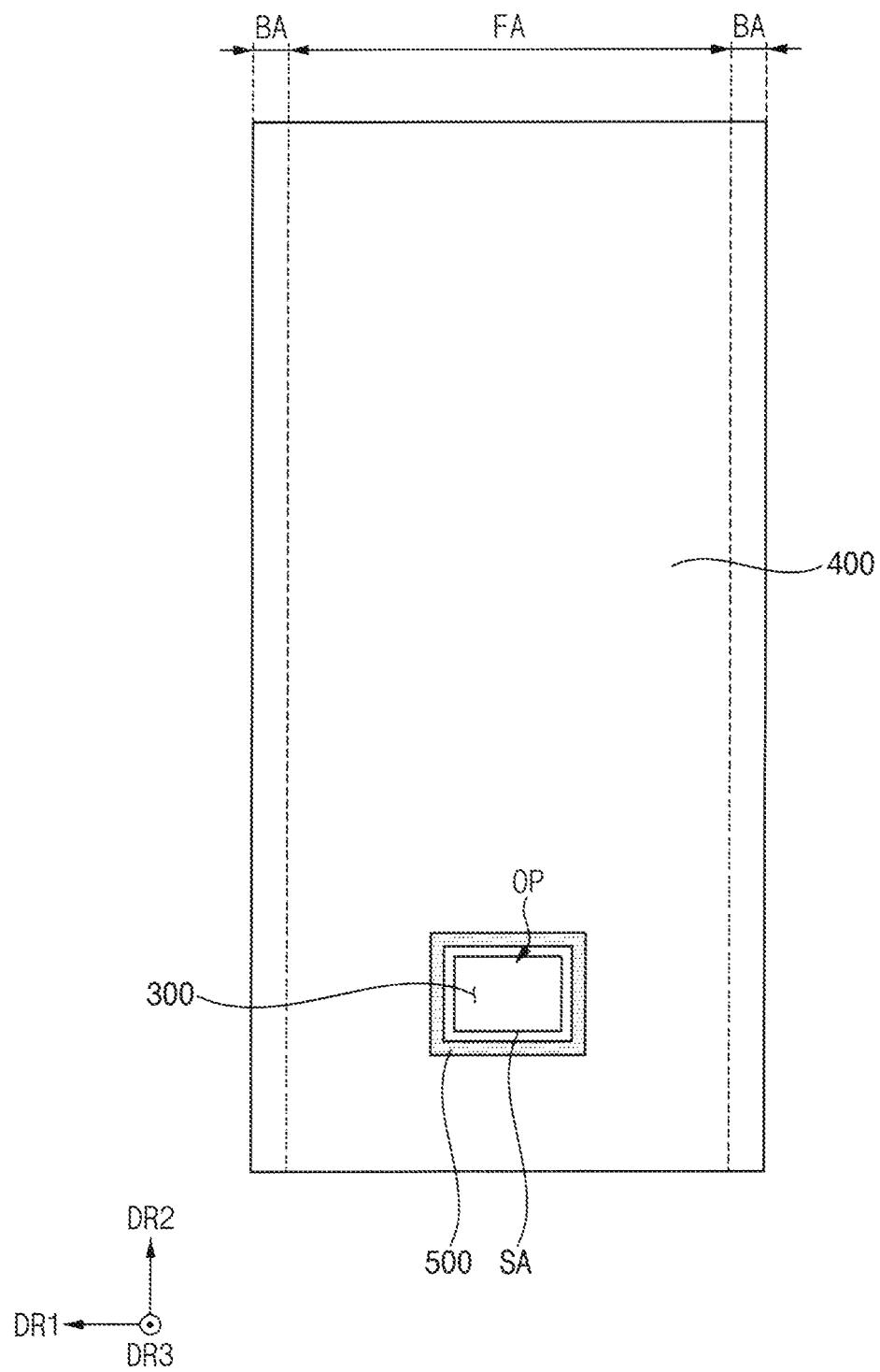
Figure 6C:
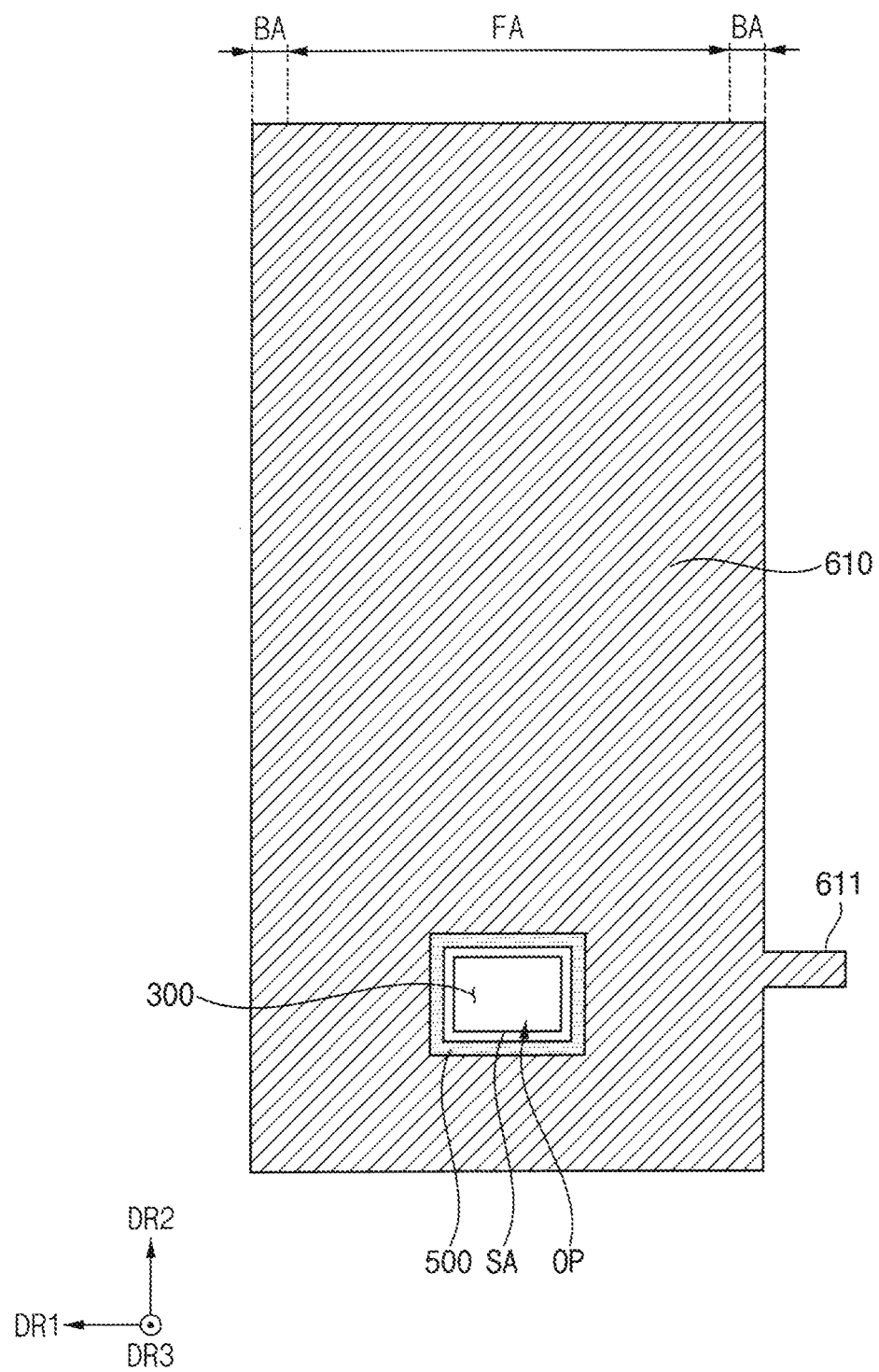

In an embodiment, for example, as shown in FIGS. 6A to 6C, the first release film 610 may surround the first buffer member 500 in a plan view. The first release film 610 may extend from the first buffer member 500 in a direction away from the opening OP. That is, the first release film 610 may include an opening OP (e.g., second opening) which is aligned or corresponding with the opening OP of the panel protective film 400. The first buffer member 500 may be disposed in the opening OP of the first release film 610.

In an embodiment, for example, as shown in FIGS. 4B and 6C, the first release film 610 may contact the first buffer member 500. In an embodiment, the first release film 610 may be spaced apart from the first buffer member 500 by a distance and may surround the first buffer member 500 in the plan view.

In an embodiment, for example, as shown in FIG. 6C, the first release film 610 may include a first grip portion 611 protruding further from the panel protective film 400 in a direction (e.g., the direction opposite to the first direction DR1) such as in a direction away from the opening OP. The first grip portion 611 may help to facilitate peeling of the release film 600 from the panel protective film 400. Referring to FIG. 6C, the first grip portion 611 may be an extended portion of the first release film 610, without being limited thereto. That is, the first grip portion 611 may be an extended portion of a release layer within the release film 600 which is closest to the panel protective film 400, without being limited thereto.

In an embodiment, a second adhesive pattern 750 may be disposed between the panel protective film 400 and the first release film 610. The first release film 610 may be adhered to the panel protective film 400 by the second adhesive pattern 750. An upper surface of the second adhesive pattern 750 may contact the lower surface of the panel protective film 400 (e.g., the lower surface of the heat dissipating member 440). A lower surface of the second adhesive pattern 750 may contact an upper surface of the first release film 610. In an embodiment, for example, the second adhesive pattern 750 may have substantially the same shape as the first release film 610 in a plan view. In an embodiment, for example, the second adhesive pattern 750 may be spaced apart from the first adhesive pattern 740 and the first buffer member 500.

In an embodiment, for example, an adhesive force between the second adhesive pattern 750 and the panel protective film 400 may be less than an adhesive force between the second adhesive pattern 750 and the first release film 610. Accordingly, when the first release film 610 is peeled from the panel protective film 400, the second adhesive pattern 750 may be peeled from the panel protective film 400 together with the first release film 610.

The second release film 620 may be disposed under the first release film 610 and the first buffer member 500, and may overlap the flat area FA and the bending area BA. In an embodiment, for example, as shown in FIG. 6F, the second release film 620 may cover the entire lower surface of the display panel 300. That is, the second release film 620 may be disposed under the first release film 610 and the first buffer member 500 to continuously cover the opening OP, the first buffer member 500 and the first release film 610. In other words, the first buffer member 500 may be disposed between the panel protective film 400 and the second release film 620 to surround the opening OP. The second release film 620 may be attached to a lower surface of the first buffer member 500 until being peeled off from the panel protective film 400 to expose the display panel 300 to outside of the panel protective film 400 at the opening OP.

In an embodiment, the second release film 620 may include substantially the same material as the first release film 610. In an embodiment, for example, the second release film 620 may include PET, PI or paper.

In an embodiment, a third adhesive pattern 770 may be disposed between the first buffer member 500 and the second release film 620. The first buffer member 500 may be adhered to the second release film 620 by the third adhesive pattern 770. An upper surface of the third adhesive pattern 770 may contact the lower surface of the first buffer member 500. A lower surface of the third adhesive pattern 770 may contact an upper surface of the second release film 620. In an embodiment, for example, the third adhesive pattern 770 may have substantially the same shape as the first buffer member 500 in a plan view.

In an embodiment, for example, an adhesive force between the third adhesive pattern 770 and the first buffer member 500 may be less than an adhesive force between the third adhesive pattern 770 and the second release film 620. Accordingly, when the second release film 620 is peeled from the panel protective film 400, the third adhesive pattern 770 may be peeled from the first buffer member 500 together with the second release film 620.

The step-difference compensation film 630 may be disposed between the first release film 610 and the second release film 620 and may overlap the first release film 610. Referring to FIGS. 6C and 6E, for example, the step-difference compensation film 630 may have substantially the same shape as the first release film 610 in a plan view. The step-difference compensation film 630 which is between the first adhesive layer and the second release film 620 may define an opening OP (e.g., third opening) which corresponds to the opening OP of the panel protective film 400.

As described above, the first buffer member 500 may be disposed only in a partial area of the lower surface of the panel protective film 400. The first release film 610 may be disposed in another area of the lower surface of the panel protective film 400 which excludes the first buffer member 500. That is, the first release film 610 may be adjacent to the first buffer member 500 in a direction along the display panel 300. In an embodiment, for example, a thickness of the first buffer member 500 may be greater than a thickness of the first release film 610. A step-difference may occur between the panel protective film 400 and the release film 600 owing to the difference in thicknesses of the first buffer member 500 and the first release film 610. That is, the step-difference may occur between a planar area corresponding to the first buffer member 500 and a planar area corresponding to the first release film 610. Accordingly, when the release film 600 is commonly attached to the bottom of the panel protective film 400 and the bottom of the first buffer member 500 (e.g., a pressing process using a roller), an adhesion failure (e.g., a lifting phenomenon of the release film 600) may occur. In order to reduce or effectively prevent the adhesion failure, the step-difference compensation film 630 may be disposed in the planar area corresponding to the first release film 610. The step-difference compensation film 630 may compensate for the step-difference and may reduce or effectively prevent or reduce the adhesion failure between the release film 600 and the panel protective film 400.

In an embodiment, the step-difference compensation film 630 may include a plurality of films. That is, depending on the size of the step-difference owing to the difference in thicknesses of the first buffer member 500 and the first release film 610 for compensation, the step-difference compensation film 630 may include the films and various adhesives which are respectively disposed between the films.

In an embodiment, a fourth adhesive pattern 780 may be disposed between the step-difference compensation film 630 and the second release film 620. The step-difference compensation film 630 may be adhered to the second release film 620 by the fourth adhesive pattern 780. Optionally, the step-difference compensation film 630 and the fourth adhesive pattern 780 may be omitted.

In an embodiment, a fifth adhesive pattern 760 may be disposed between the first release film 610 and the step-difference compensation film 630. That is, the fifth adhesive pattern 760 may be disposed between the first release film 610 and the second release film 620. In an embodiment, the display module DM may include an adhesive layer (e.g., fifth adhesive pattern 760) which is between the third release film 640 and the second release film 620 and attaches the third release film 640 to the second release film 620. In an embodiment, for example, the fifth adhesive pattern 760 may have substantially the same shape as the first release film 610 in a plan view. In an embodiment, for example, the fifth adhesive pattern 760 may be spaced apart from the first buffer member 500.

As shown in FIG. 4B, a lower surface of the fifth adhesive pattern 760 may contact an upper surface of the step-difference compensation film 630. When the step-difference compensation film 630 is omitted, the lower surface of the fifth adhesive pattern 760 may contact the upper surface of the second release film 620.

The third release film 640 may be disposed between the first release film 610 and the second release film 620, and may overlap the bending area BA. That is, the third release film 640 may be disposed between the first release film 610 and the second release film 620 and may correspond to a first bent end and a second bent end (e.g., left and right) of the display panel 300. In an embodiment, for example, the third release film 640 may be disposed between the first release film 610 and the step-difference compensation film 630. The third release film 640 may be spaced apart from the first buffer member 500. A thickness of the third release film 640 may be less than the thickness of the first release film 610.

Figure 6D:
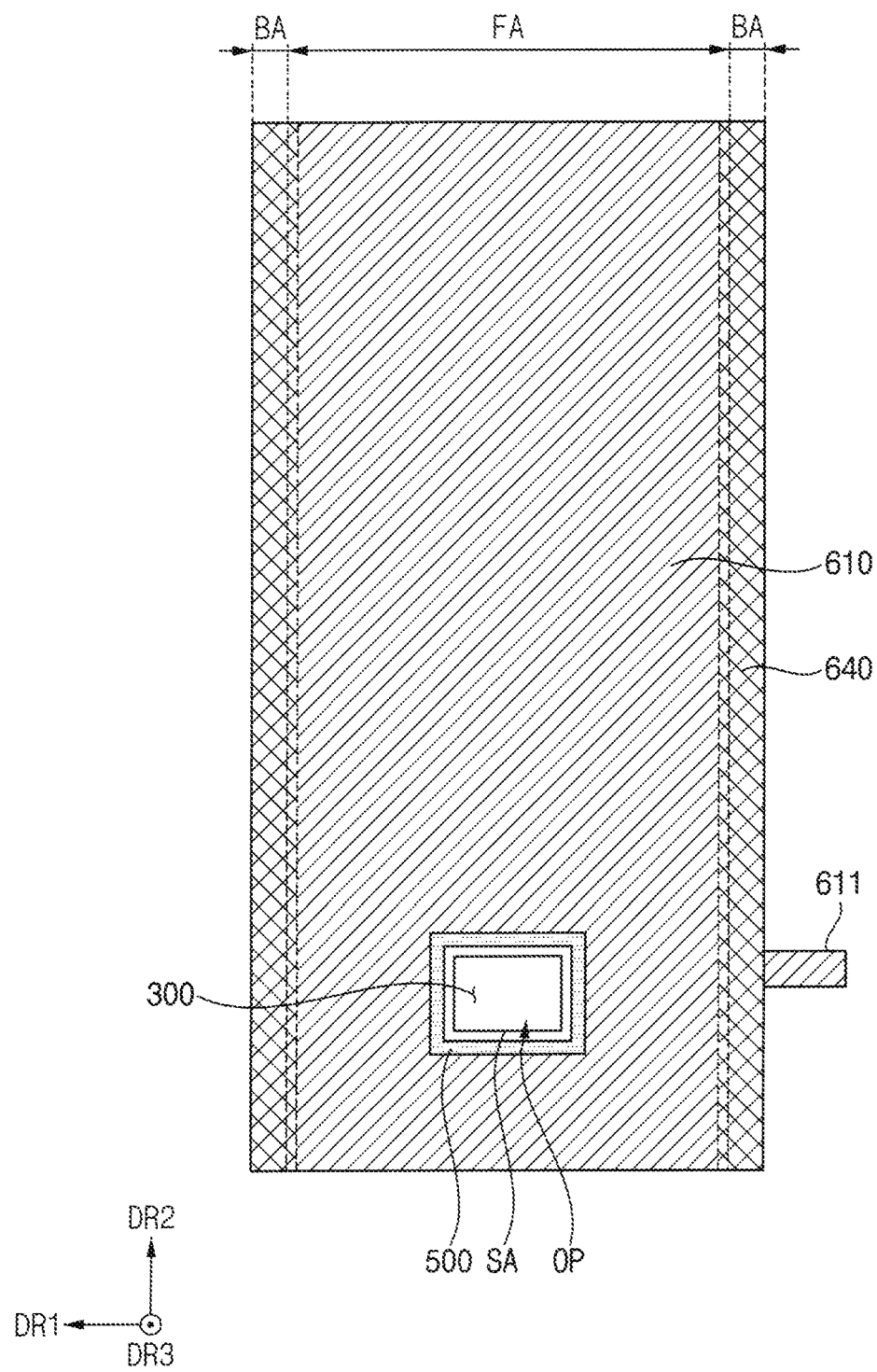
Figure 6E:
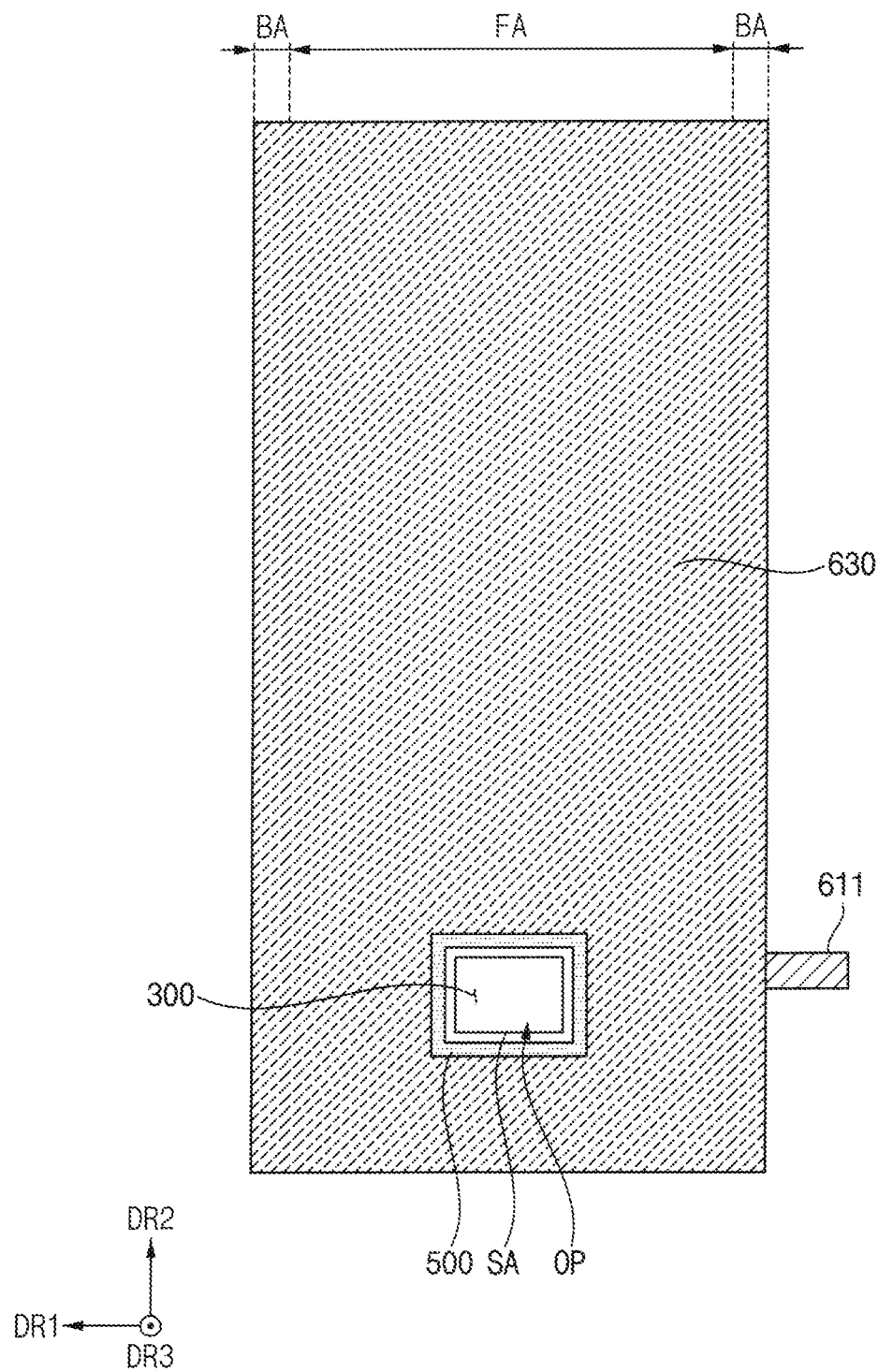
Figure 6F:
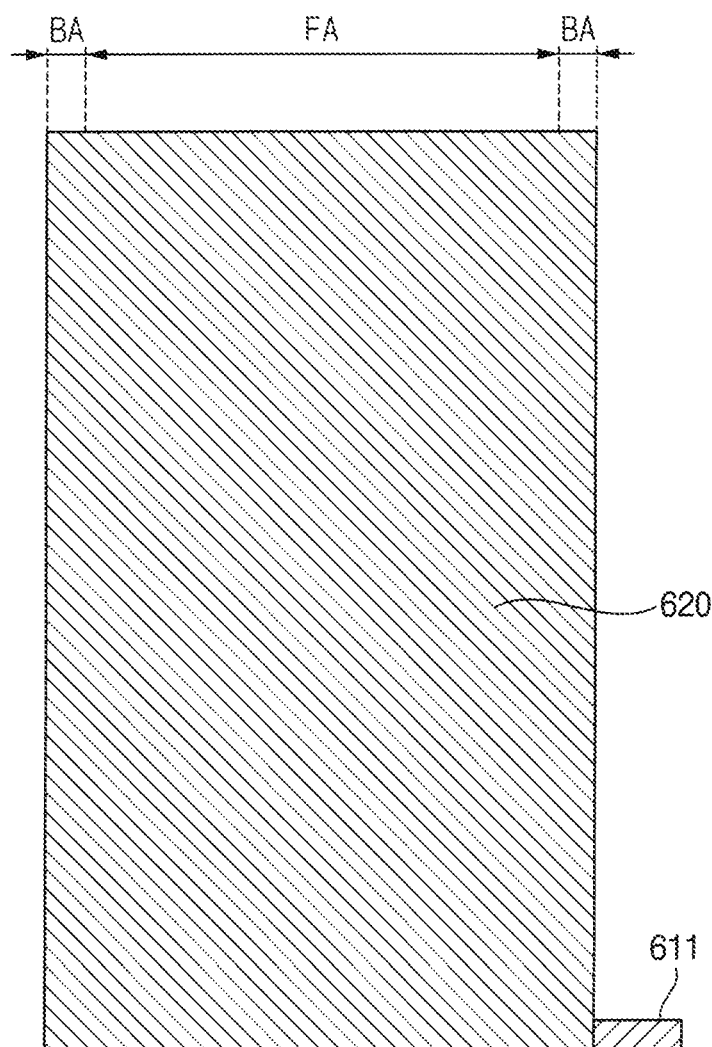

In an embodiment, as shown in FIG. 6D, a portion of the third release film 640 may overlap the flat area FA. That is, the third release film 640 may have a larger planar area than a planar area of the bending area BA in a plan view, and may overlap both the bending area BA and a portion of the flat area FA. In an embodiment, the third release film 640 may not overlap the flat area FA (e.g., may be excluded from the flat area FA). That is, the third release film 640 may overlap only the bending area BA.

In an embodiment, the third release film 640 may include substantially the same material as the first release film 610. In an embodiment, for example, the third release film 640 may include PET, PI or paper.

The third release film 640 may be disposed between the first release film 610 and the fifth adhesive pattern 760. That is, an upper surface of the third release film 640 may directly contact a lower surface of the first release film 610. A lower surface of the third release film 640 may directly contact an upper surface of a portion of the fifth adhesive pattern 760.

In an embodiment, for example, the fifth adhesive pattern 760 may include a first portion 761 directly contacting the first release film 610 and a second portion 762 spaced apart from the first release film 610 by directly contacting the third release film 640. The first portion 761 of the fifth adhesive pattern 760 may attach the first release film 610 to the step-difference compensation film 630 (or the second release film 620). The second portion 762 of the fifth adhesive pattern 760 may attach the third release film 640 to the step-difference compensation film 630 (or the second release film 620). The first portion 761 of the fifth adhesive pattern 760 may overlap the flat area FA. At least a portion of the second portion 762 of the fifth adhesive pattern 760 may overlap the bending area BA. That is, as shown in FIG. 4B, a portion of the first release film 610 overlapping the flat area FA may be adhered to the step-difference compensation film 630 by the first portion 761 of the fifth adhesive pattern 760. Omission of the step-difference compensation film 630 disposes a portion of the first release film 610 overlapping the flat area FA to be adhered to the second release film 620 at the flat area FA.

FIGS. 4B and 5 illustrate that a thickness of the first portion 761 of the fifth adhesive pattern 760 is different from a thickness of the second portion 762 of the fifth adhesive pattern 760, but the thickness of the first portion 761 of the fifth adhesive pattern 760 may be substantially the same as the thickness of the second portion 762 of the fifth adhesive pattern 760. That is, the fifth adhesive pattern 760 may be disposed as a substantially uniform thickness along profiles of the first and fourth release films 610 and 640.

In an embodiment, an adhesive may not be disposed between the first release film 610 and the third release film 640. That is, the upper surface of the third release film 640 may not be adhered to a lower surface of the first release film 610 (e.g., may be unattached to the first release film 610). In an embodiment, the third release film 640 directly contacts the first release film 610 while be unattached thereto. As shown in FIG. 5, at least a portion (e.g., an end portion at the bending area BA) of the third release film 640 may be unattached to the first release film 610. In other words, in the flat area FA, the first release film 610, the step-difference compensation film 630 and the second release film 620 may be adhered or removably attached to the bottom of the panel protective film 400. In the bending area BA, only the first release film 610 of the release film 600 may be adhered or removably attached to the bottom of the panel protective film 400, while the step-difference compensation film 630 and the second release film 620 corresponding to the third release film 640 may be unattached to the panel protective film 400 due to the third release film 640. That is, a portion of a release film 600 having a relatively thin thickness may be adhered to the bending area BA of the panel protective film 400. Accordingly, an adhesion failure between the bending area BA of the panel protective film 400 and the bending area BA of the first release film 610 may be improved. Accordingly, reliabilities of the display panel 300, the display module DM including the display panel 300 and the display device DD including the display module DM may be improved.

In an embodiment, the release film 600 may further include a fourth release film 650 disposed under the second release film 620 and overlapping the sensing area SA. That is, the fourth release film 650 may overlap the opening OP of the panel protective film 400 and may cover the opening OP. A sixth adhesive pattern 790 may be disposed between the second release film 620 and the fourth release film 650. In an embodiment, for example, the fourth release film 650 may include substantially the same material as the first release film 610, and may further include a light blocking material such as a pigment, a dye or a carbon black.

Figure 6G:
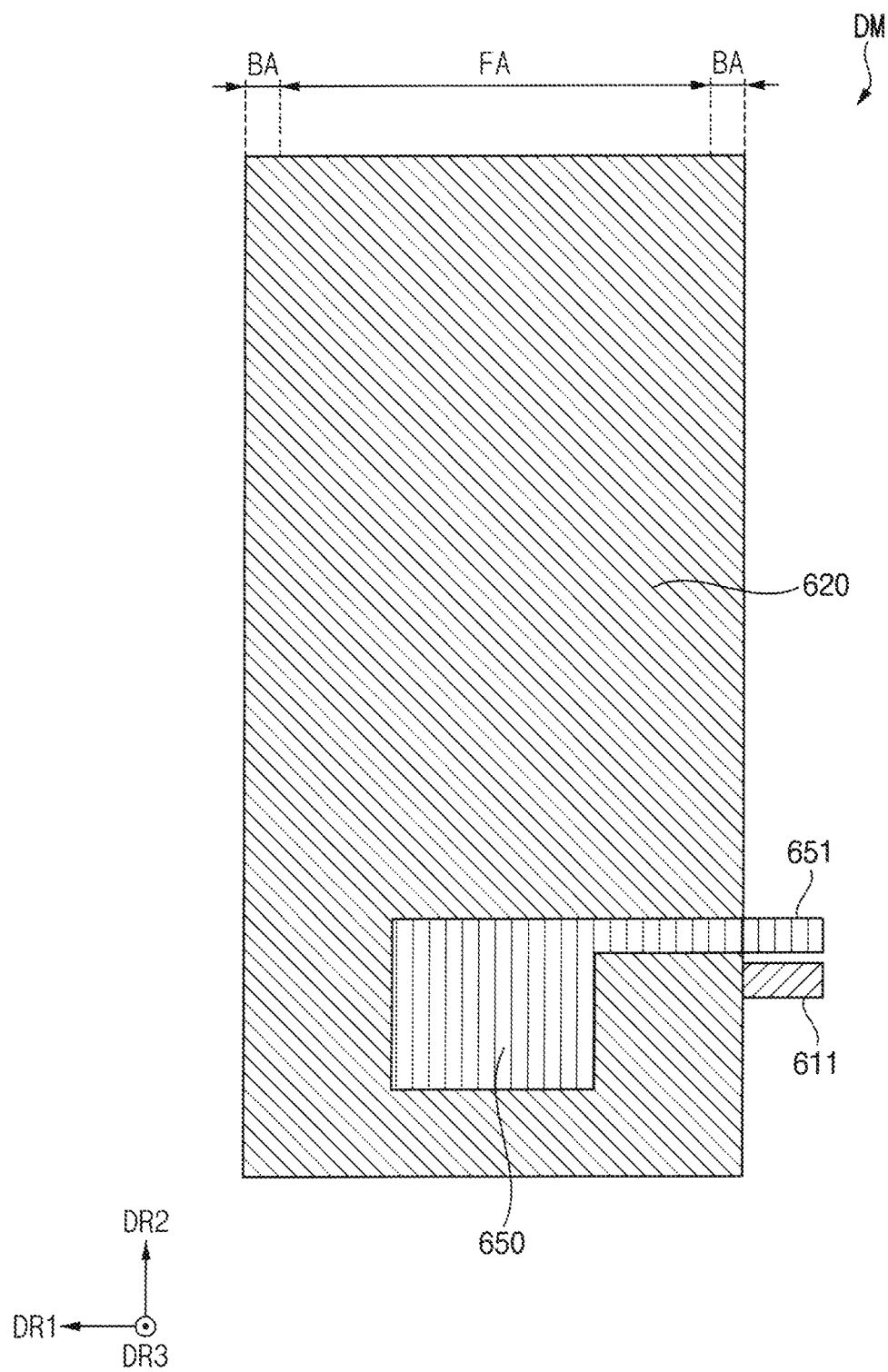

As shown in FIG. 6G, the fourth release film 650 include a second grip portion 651 protruding further from the panel protective film 400 in a direction (e.g., the direction opposite to the first direction DR1). The second grip portion 651 of the fourth release film 650 may not overlap the first grip portion 611 of the first release film 610 in a plan view. In an embodiment, the second grip portion 651 of the fourth release film 650 may overlap the first grip portion 611 of the first release film 610 in a plan view. Referring to FIG. 6G, the second grip portion 651 may be an extended portion of the fourth release film 650, without being limited thereto. That is, the second grip portion 651 may be an extended portion of a release layer within the release film 600 which is furthest from the panel protective film 400, without being limited thereto.

Figure 7:
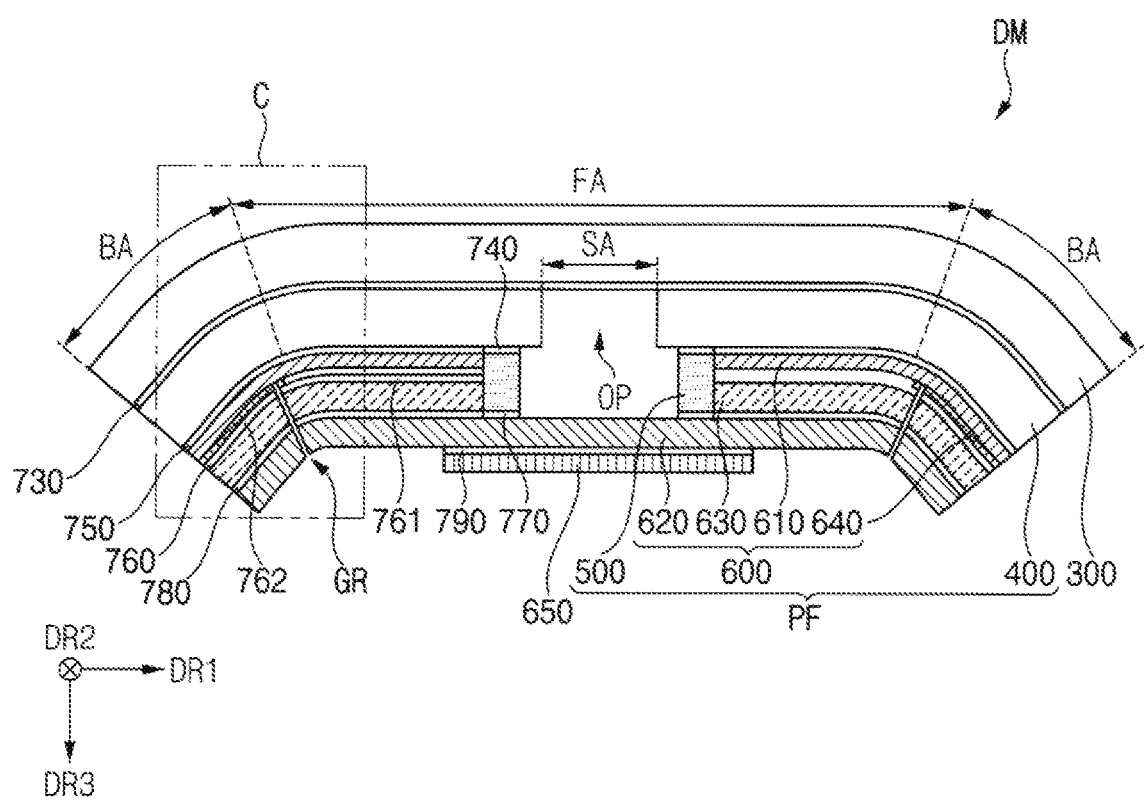
FIG. 7 is a cross-sectional view of an embodiment of a display module.
Figure 8:
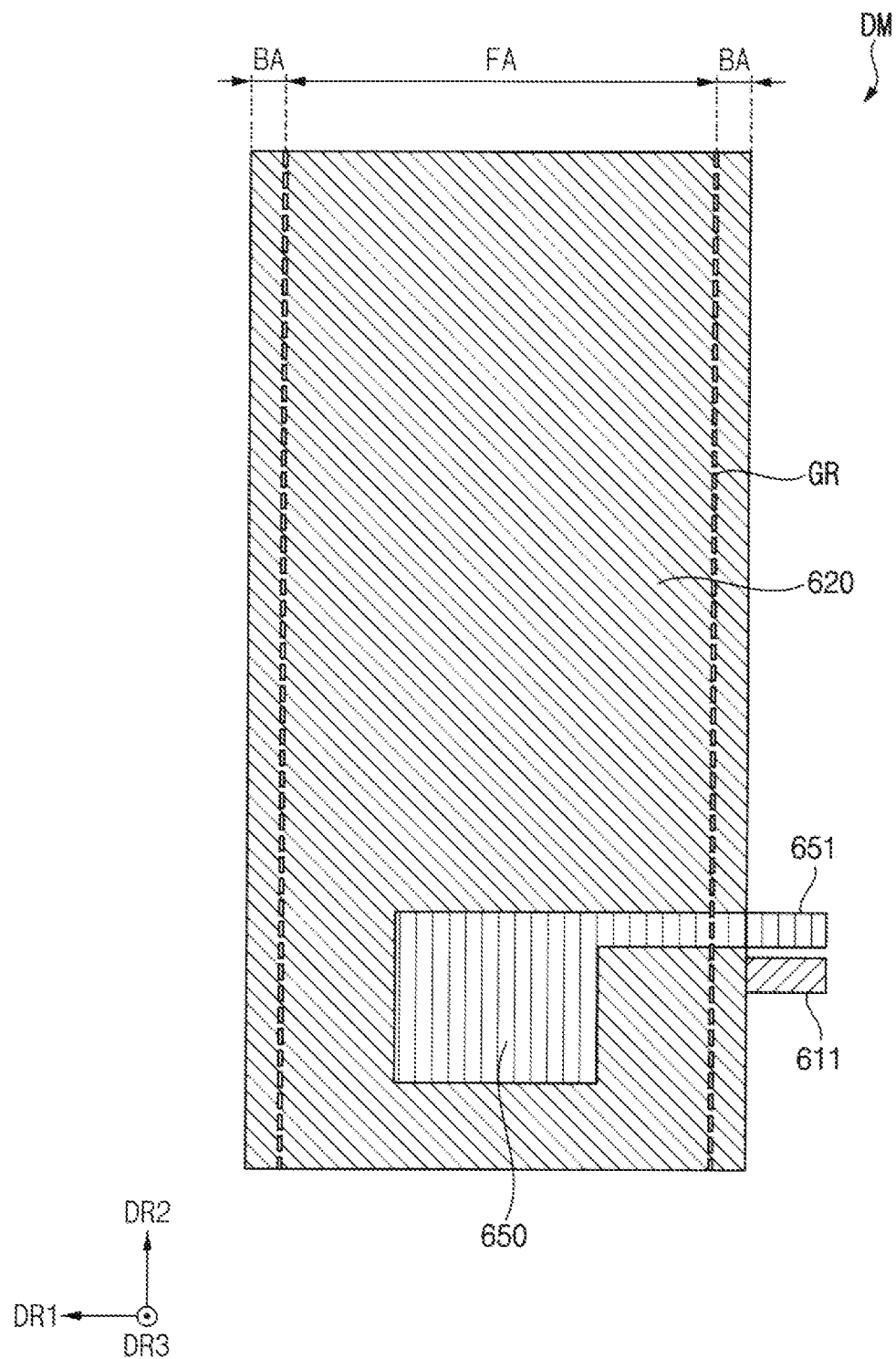
FIG. 8 is a bottom view of the display module of FIG. 7.
Figure 9:
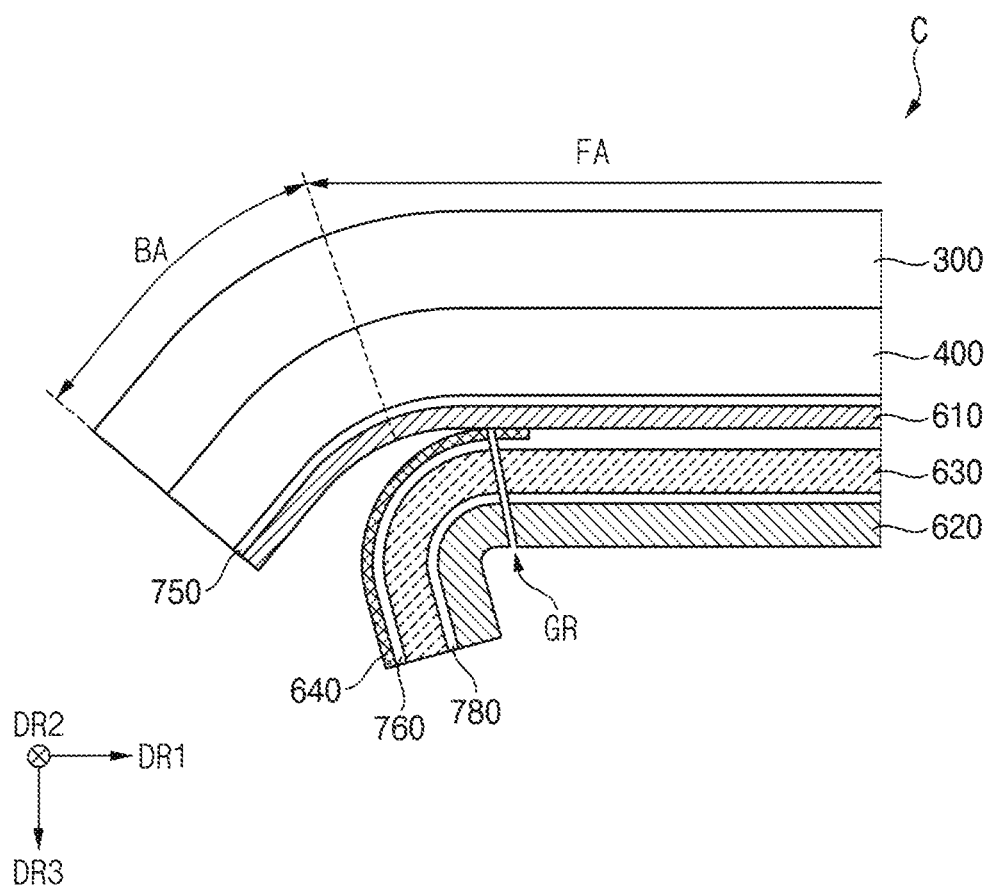
FIG. 9 is an enlarged cross-sectional view illustrating an area "C" of FIG. 7.

FIG. 7 is a cross-sectional view of an embodiment of a display module DM. FIG. 8 is an embodiment of a bottom view of the display module DM of FIG. 7. FIG. 9 is an enlarged cross-sectional view illustrating an area "C" of FIG. 7.

Referring to FIGS. 7 to 9, the release film 600 may have a groove GR provided in plural including a plurality of grooves GR arranged spaced apart from each other along the bending area BA. The grooves GR may facilitate bending in a direction away from the display panel 300 of various layers of the release film 600 at the bending area BA. Each of the grooves GR may overlap the panel protective film 400. As shown in FIG. 8, the grooves GR may be disposed to be spaced apart from each other along a boundary between the flat area FA and the bending area BA. That is, the grooves GR may be spaced apart from each other along the second direction DR2.

In an embodiment, each of the grooves GR may pass through a thickness of the second release film 620, the step-difference compensation film 630 and the third release film 640. That is, the grooves GR may be provided or formed in each of the second release film 620, the step-difference compensation film 630 and the third release film 640. In addition, each of the grooves GR may further pass through the fifth adhesive pattern 760 and the third adhesive pattern 770.

Each of the grooves GR may not pass through the first release film 610. That is, the grooves GR may not be provided or formed through a thickness of the first release film 610. In other words, each of the grooves GR may expose a portion of the first release film 610 to outside the release film 600. Accordingly, each of the grooves GR may not expose the lower surface of the panel protective film 400 (e.g., the lower surface of the heat dissipating member 440). Accordingly, marks due to the grooves GR may not remain on the lower surface of the panel protective film 400.

Although embodiments and implementations have been described herein, other embodiments and modifications will be apparent from this description. Accordingly, the invention is not limited to such embodiments, but rather to the broader scope of the appended claims and various obvious modifications and equivalent arrangements as would be apparent to a person of ordinary skill in the art.

What is claimed is:

1. A display module comprising:
    a display panel which is bent at opposing ends thereof, the display panel including a flat area and a bent area which extends bent from the flat area;
    a panel protective film which faces both the flat area and the bent area of the display panel; and
    a release film which is removably attached to the panel protective film, the release film comprising:
        a first release film which faces both the flat area and the bent area of the display panel with the panel protective film therebetween;
        a second release film which faces the display panel with the first release film therebetween;
        a third release film which is between the first release film and the second release film and corresponds to the bent area; and
        a first adhesive layer which is between the third release film and the second release film and attaches the third release film to the second release film.

2. The display module of claim 1, wherein at the bent area of the display panel, the third release film directly contacts the first release film.

3. The display module of claim 2, wherein at the bent area of the display panel, the third release film is unattached to the first release film.

4. The display module of claim 1, wherein at the bent area of the display panel, the third release film is spaced apart from the first release film.

5. The display module of claim 1, wherein the first adhesive layer includes:
    a first portion which directly contacts the first release film, and
    a second portion which is connected to the first portion and directly contacts the third release film.

6. The display module of claim 5, wherein
    the first portion of the first adhesive layer attaches the first release film to the second release film, and the second portion of the first adhesive layer attaches the third release film to the second release film.

7. The display module of claim 5, wherein
the first portion of the first adhesive layer corresponds to the flat area, and
the second portion of the first adhesive layer corresponds to the bent area.

8. The display module of claim 1, wherein
each of the third release film and the first release film has a thickness, and
the thickness of the third release film is less than the thickness of the first release film.

9. The display module of claim 1, further comprising a second adhesive layer between the panel protective film and the first release film and attaches the panel protective film to the first release film,
wherein
the second adhesive layer has an adhesive force with the panel protective film and an adhesive force with the first release film, and
the adhesive force of the second adhesive layer with the panel protective film is less than the adhesive force of the second adhesive layer with the first release film.

10. The display module of claim 1, wherein
the display panel further includes a sensing area in the flat area at which an external input to the display module is sensable, and
the panel protective film defines an opening which corresponds to the sensing area and exposes the display panel to outside the panel protective film,
further comprising an impact-absorbing pattern which protrudes from the panel protective film in a direction away from the display panel and extends along the opening of the panel protective film.

11. The display module of claim 10, wherein
the first release film defines an opening which corresponds to the opening of the panel protective film, and
the impact-absorbing pattern is in the opening of the first release film.

12. The display module of claim 11, wherein the impact-absorbing pattern extends from the opening of the first release film and further than the first release film in the direction away from the display panel.

13. The display module of claim 12, wherein
the impact-absorbing pattern which extends along the opening of the panel protective film forms a step with the panel protective film,
the release film further comprises a step-difference compensation film which is between the first adhesive layer and the second release film and defines an opening which corresponds to the opening of the panel protective film, and
the impact-absorbing pattern is in the opening of the step-difference compensation film.

14. The display module of claim 10, wherein at the flat area of the display panel, the second release film extends across the opening of the panel protective film and disposes both the impact-absorbing pattern and the first release film between the display panel and the second release film.

15. The display module of claim 10, wherein the third release film is spaced apart from the impact-absorbing pattern in a direction along the panel protective film.

16. The display module of claim 10, the release film further comprises a fourth release film which faces the impact-absorbing pattern with the second release film therebetween and corresponds to the opening of the panel protective film.

17. The display module of claim 16, wherein the fourth release film which corresponds to the opening of the panel protective film includes a light blocking material.

18. The display module of claim 1, wherein
the display panel further includes a boundary between the flat area and the bent area, and
the second release film and the third release film together define a plurality of grooves arranged spaced apart from each other along the boundary between the flat area and the bent area.

19. The display module of claim 18, wherein at the flat area of the display panel, each of the plurality of grooves corresponds to the panel protective film.

20. The display module of claim 18, wherein each of the plurality of grooves exposes the first release film to outside the release film.

* * * * *